United States Patent [19]

Kawai

[11] Patent Number: 4,677,619

[45] Date of Patent: Jun. 30, 1987

[54] METHOD AND APPARATUS FOR SUPERVISING DIGITAL RADIO TRANSMISSION LINE

[75] Inventor: Masahisa Kawai, Zama, Japan

[73] Assignee: Fujitsu Limited, Kawasaki, Japan

[21] Appl. No.: 657,000

[22] Filed: Oct. 2, 1984

[30] Foreign Application Priority Data

Oct. 5, 1983 [JP] Japan ................................. 58-186166

[51] Int. Cl.$^4$ ........................ H04L 1/02; G06F 11/00
[52] U.S. Cl. ............................................. 371/5; 371/8
[58] Field of Search ........................... 371/5, 8; 375/40

[56] References Cited

U.S. PATENT DOCUMENTS

| | | | |
|---|---|---|---|
| 3,976,948 | 8/1976 | Dearden et al. ..................... | 328/138 |
| 4,034,340 | 7/1977 | Sant'Agostino ..................... | 371/5 X |
| 4,241,445 | 12/1980 | Payen ........................................ | 371/5 |
| 4,328,581 | 5/1982 | Harmon et al. ......................... | 371/8 |
| 4,379,993 | 4/1983 | Holden ................................. | 328/120 |
| 4,393,499 | 7/1983 | Evans ........................................ | 371/5 |
| 4,399,354 | 8/1983 | Schaeffer ............................. | 377/26 |
| 4,462,099 | 7/1984 | Braun ..................................... | 371/8 X |
| 4,490,817 | 12/1984 | Turner .................................. | 371/5 X |
| 4,566,100 | 1/1986 | Mizuno et al. ......................... | 371/5 |

*Primary Examiner*—Charles E. Atkinson
*Attorney, Agent, or Firm*—Staas & Halsey

[57] ABSTRACT

A supervisory system is disclosed for a digital radio transmission line connected between a transmitter part and a receiver. The receiver produces error pulses from a portion on the transmitted message used for error rate detection sent from the transmitter. Transmission line quality is estimated in accordance with the variation of time intervals between each two successive error pulses.

7 Claims, 8 Drawing Figures

Fig. I   PRIOR ART

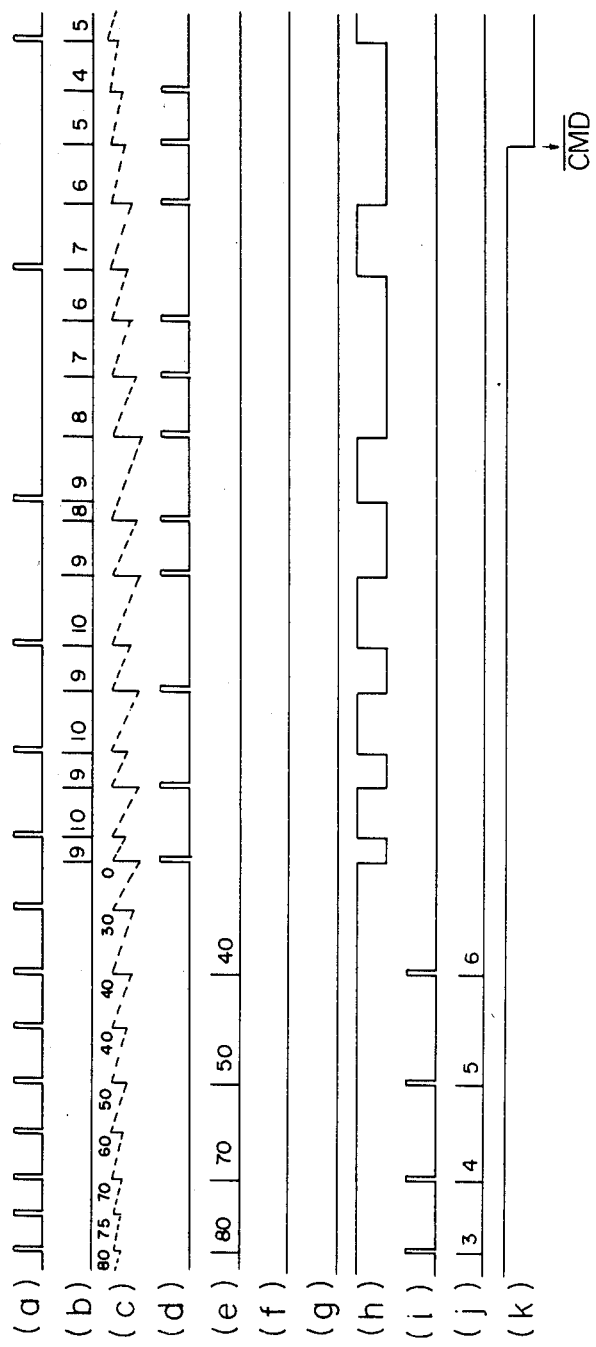

METHOD AND APPARATUS FOR SUPERVISING DIGITAL RADIO TRANSMISSION LINE

BACKGROUND OF THE INVENTION

1. Field of the Invention

The present invention relates to a supervisory system for a radio transmission line, more particularly, it relates to a supervisory system which rapidly detects deterioration in the quality of the digital radio signal transmitted over the transmission line and performs transmission line switching when such deterioration is detected.

2. Description to the Prior Art

The recent trend in radio communication systems is for various information to be transformed into digital signals and the thus transformed information transmitted to a remote office through a digital radio transmission line. In such radio communication systems, the level of the received signal at the receiver side is often subjectd to extreme variations due to fading and the like occurring in the radio transmission line, and therefore, required transmission quality cannot be attained. In a conventional system, this quality deterioration is checked by continuous scanning an error rate in the normal and emergency lines. If the error rate in a normal line increases to a predetermined threshold value, transmission through the normal line is stopped and changed to an emergency line by, for example, space diversity, frequency diversity, or polarization wave diversity, so that the desired transmission quality can be assured.

A problem occurring in a prior art supervisory system, is that a line switching command cannot be issued rapidly. That is, too long a period must elapse before the line can be switched. Thus, by the time the line switching command is actually provided, the quality deterioration in the transmission line has become very serious; particularly when fading occurs not gradually but suddenly. The reason for the above will be descussed in detail hereinafter, but briefly, it is because the line switching command in a prior art system is generated in accordance with average error rate, which is determined every time a predetermined constant observation period is completed.

SUMMARY OF THE INVENTION

It is an object of the present invention to provide a method and apparatus for supervising a digital radio transmission line, which will enable the line switching command to be rapidly issued.

The above object is attained using a method and apparatus for measuring time interval between successive error pulses which define the error rate and determining whether or not the line switching command is to be issued in accordance with variation in the time intervals.

The time interval between errors is measured by a time interval counter unit which outputs data concerning the equivalent number of errors for a fixed time period. The number of errors is stored in a memory. The memory stores the smallest number received since the last reset. A comparison unit compares the smallest number with an integrated number of actual errors provided by an up/down counter and produces a line switching signal if the stored smallest number is less than the integrated number.

These together with other objects and advantages which will be subsequently apparent, reside in the details of construction and operation as more fully hereinafter described and claimed, reference being had to the accompanying drawings forming a part hereof, wherein line numerals refer to like parts throughout.

BRIEF DESCRIPTION OF THE DRAWINGS

The present invention will be more apparent from the ensuing description with reference to the accompanying drawings, wherein:

FIGS. 6A, 6B, and 6C depict timing charts of signals appearing at main portions in the circuit of FIG. 5.

DESCRIPTION OF THE PREFERRED EMBODIMENTS

Before describing the preferred embodiments, a prior art supervisory system will be explained for comparison.

Figure 1:
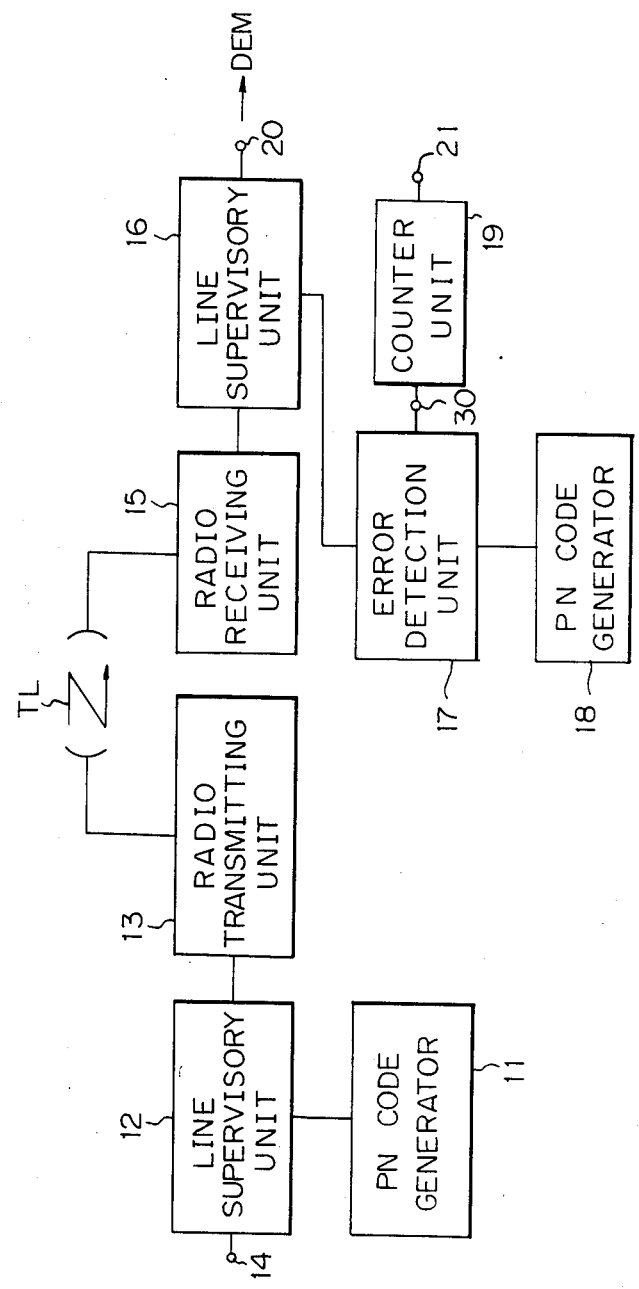
FIG. 1 is a general block diagram of a conventional digital radio communication system.

FIG. 1 is a general block diagram of a conventional digital radio communication system. In FIG. 1, a data signal to be transmitted is supplied to an input terminal 14 of a transmitter and transmitted by a radio transmitting unit 13, via a transmission line or path TL which includes antennas, to a receiver, in which the data signal received, by a radio receiving unit 15, is output from an output terminal 20 and demodulated by a demodulator (DEM) to reproduce the original data. Reference numeral 11 represents a pseudonoise (PN) code generator which generates a PN code signal for detecting an error rate of the data signal. The PN code signal for detecting the error rate is contained in the data signal in the form of frame synchronization bits or parity bits. The PN code signal is inserted by a line supervisory unit 12 into the data signal, and then transmitted from the radio transmitting unit 13 to the remote receiver. In the line supervisory unit 12, the PN code bits of the PN code signal are inserted into the data bits of the data signal at a ratio of, for example, 1:100. That is, a transmission speed ratio is converted from 100 to 101 in the unit 12.

In the receiver, the data and PN code signals are received at the radio receiving unit 15 and the PN code signal is selectively removed therefrom in a line supervisory unit 16, in which the transmission speed ratio is converted from 101 to 100. The thus detected PN code and a reference PN code are applied to an error detection unit 17. The reference PN code signal is provided by a reference PN code generator 18. This reference PN code is equivalent to that generated in the transmitter part by the generator 11. In the error detection unit 17, both the received PN code and the reference code are compared bit by bit. Due to the comparison in the unit 17, every time both bits do not coincide, an error pulse is produced and output at a supervisory terminal 30. Then a counter unit 19 connected to the supervisory terminal 30 at its input operates to count the number of the produced error pulses. The counter unit 19 further operates to determine whether or not each count number exceeds a predetermined threshold value every time a predetermined constant observation term or period for each error pulse is completed. If the count number is exceeded, the counter unit 19 discriminates whether the error rate of the transmission line has become worse than, for example, $10^{-3}$. After this discrimination is completed, a line command is issued from a decision terminal 21 if appropriate. The above-recited error rate value of $10^{-3}$ signifies that one error bit occurs per 1000 bits of the data signal. In accordance with international standards, a transmission line with an error rate value of $10^{-3}$ cannot be put into commercial use, because an error rate value of $10^{-7}$ through $10^{-12}$ is considered required for a commercially available transmission line.

In summation, in the prior art, the line switching command is issued in accordance with average error rate. However, as previously mentioned, in the prior art supervisory system the problem occurs where it often takes too long to issue the line switching command when the position of the observation time slot is unfavorable with respect to the time at which the error rate starts deteriorating.

The present invention is specifically directed to a supervisory system comprised of members other than said main data processing members 13, 14, 15, 20 and DEM shown in the system of FIG. 1.

Figure 2:
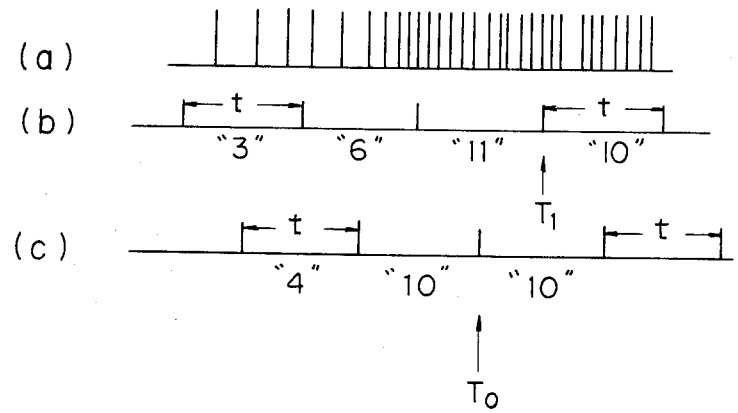
FIG. 2 depicts pulse patterns used for explaining the relationship in time between the location of the observation time slots and the issuance of the line switching command.

FIG. 2 depicts pulse patterns for explaining the relationship in time between the location of the observation time slots and the issuance of the line switching command for FIG. 1. The pulse patterns exemplify a case where the line switching command is issued for a changeover from the normal line to the emergency line, when the error rate in the normal line exceeds a value of $10^{-3}$. The error pulses for determining the error rate are illustrated in row (a) of FIG. 2. The error pulses can be obtained in the same manner as in the prior art previously described with respect to FIG. 1. That is, a pseudo noise generator and supervisory unit of the transmitter can insert a predetermined—known bit pattern pseudo noise signal into fixed bit positions in the data signal at a given ratio. The receiver removes the pseudo noise signal from the received signal and produces an error signal when the received pseudo noise signal and a known reference pseudo noise signal do not match. It is also possible to use other housekeeping parts or portions of the message, which have known bit patterns, to detect errors. For example, the preamble which is a known bit pattern can be used, a cyclic redundancy code or parity bits can also be used, since it is possible to determine whether these portions of the message are in error. As shown in FIG. 2, when ten or more error pulses occur in each observation time slot of term or period t, which indicates the occurrence of an error rate value of $10^{-3}$ or more, the line switching command must be issued at the time when ten successive error pulses are detected. In row (b) of FIG. 2, numerals enclosed by quotation marks denote a number of measured error pulses in each observation time slot of the term t with the arbitrary error pulse pattern shown in row (a) and row (c) of FIG. 2. According to the observation time slots of row (b), ten or more error pulses in each time slot are measured in the third time slot, as shown by the number "11". Accordingly, the line switching command can be issued at the end of the third time slot, i.e., at the time $T_1$. Alternatively, according to the observation time slots of row (c), ten error pulses are measured in the second time slot as shown by the number "10". Accordingly, the line switching command can be issued at the end of the second time slot, i.e., at the time $T_0$. A comparison of the two modes of rows (b) and (c) will show that, if the observation time slots are located in the arrangement of row (b), the issuance timing of the line switching command for row (b) is delayed as compared to that of row (c) by $T_1$-$T_0$.

As mentioned above, in the prior art, the transmission line quality is estimated in accordance with variation in the average error rate, i.e., the number of the error pulses contained in each time slot. Therefore, by the time the line switching command is actually issued, the quality deterioration in the transmission line can become serious; for example, if a quick change in the fading occurs in which the number of error pulses is quickly increased, the difference in time between $T_0$ and $T_1$ may be as much as 10 ms through 100 ms. However, in a typical digital radio communication system, the synchronization necessary in the receiver cannot be achieved if the data signal is not supplied at a normal period of over 10 ms.

The present invention is based on the above-mentioned observations and has as its object the provision of a supervisory system in which the line switching command is issued in accordance with a changing ratio of the error pulses, which ratio is determined by detecting the variation of the time intervals of the error pulses.

Figure 3:
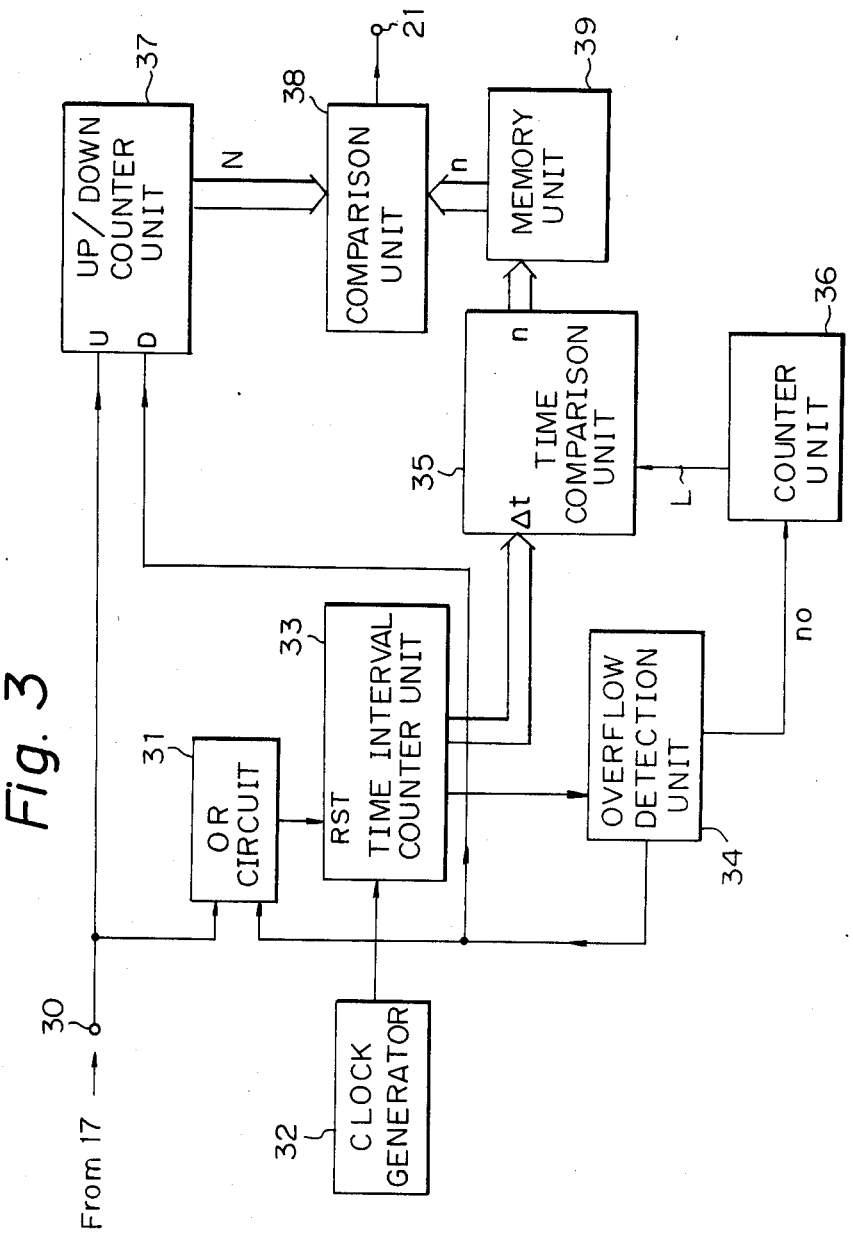
FIG. 3 is a general block diagram of a supervisory system of the digital radio transmission line according to an embodiment of the present invention.

FIG. 3 is a general block diagram of a supervisory system of the digital radio transmission line according to an embodiment of the present invention. The supervisory system of FIG. 3 is provided in the receiver of the digital radio communication system. In particular, it is located at the output stage of the error detection unit 17 of FIG. 1 and connected thereto via the supervisory terminal 30 (shown in both FIGS. 1 and 3) for producing the error pulses (refer to row (a) of FIG. 2). The decision terminal 21 is also shown in FIG. 1, and the line switching command is issued therefrom if there is an increase in the error pulses.

The supervisory terminal 30 is connected to a comparison unit 38 via a first input of an up/down counter 37, and to a time interval counter unit 33 via a first input of a OR circuit 31. The time interval counter unit 33 is driven by the clock generator 32, and connected to the comparison unit 38 via a time comparison unit 35 and memory unit 39. An overflow detection unit 34 is connected, to both a second input of the OR circuit 31 and a second input of the up/down counter unit 37, and to the time comparison unit 35 via a counter unit 36. The counter unit 36 is connected to the memory unit 39, and memory 39 is connected to the comparison unit 38. The comparison unit 38 is provided, at its output stage, with the decision terminal 21. The operation of the above system is as follows.

First, error pulses are supplied one by one from the supervisory terminal 30. Each supplied error pulse resets the time interval counter unit 33 via the first input of the OR circuit 31. After this reset operation by the error pulse, the time interval counter unit 33 starts counting the clock pulses output from the clock generator 32 and continues the count operation until the time interval counter unit 33 is reset by another following error pulse, thereby measuring one desired time interval between two successive error pulses. The thus measured time interval is then supplied to the time comparison unit 35. If the following error pulse is not supplied from the supervisory terminal 30 within a predetermined constant term, the time interval counter unit 33 cannot be reset to zero, and therefore, the count number will overflow. The overflow is detected by the overflow detection unit 34, which resets the time interval counter unit 33 via the second input of the OR circuit 31.

The above count number of the time interval counter unit 33 is supplied to the time comparison unit 35. The unit 35 contains a read only memory (ROM) in which predetermined changing ratio information is stored, such as shown below in Table I; where $\Delta t$ denotes the time interval in ms between which two successive error pulses are generated, and n denotes a number of corresponding error pulses that would be produced if many error pulses with the same time interval $\Delta t$ were allowed to be received, that is n indicats a projected count number.

TABLE I

| $\Delta t$ (ms) | n |
|---|---|
| 1-2 | 2 |
| 2-4 | 3 |
| 4-8 | 4 |
| 8-16 | 5 |
| 16-32 | 7 |
| 32- | 10 |

The above values of $\Delta t$ and n are provided only as an example and actual values can be freely determined according to the constraints of the system designer.

The changing ratio information defined by $\Delta t$ and n indicates that (see top row of table) if two successive error pulses occur with a time interval of 1 through 2 ms, the transmission line quality is assumed to have an error rate value of over $10^{-3}$, and accordingly, the line switching command must be issued immediately. The bottom row of the table indicates that if two successive error pulses occur with a time interval value of over 32 ms, the transmission line quality is also assumed to have an error rate value of below $10^{-3}$, and the related command must soon be issued. The above also applies to the remaining information ($\Delta t$, n) not discussed in detail. Thus, the time comparison unit 35 operates first to receive input data concerning the time interval $\Delta t$ sent from the unit 33, and then to produce output data concerning the number n of error pulses corresponding to the thus received input data of $\Delta t$, in accordance with the above recited Table I. The corresponding number n determined by the unit 35 is supplied to the memory unit 39 and stored therein. In this case, the memory unit 39 operates in such a manner that the number n to be sorted therein is always updated with a value smaller than any stored before. That is, the least or smallest value n is always maintined. This least value n is then transferred from the memory unit 39 to the comparison unit 38.

The comparison unit 38, receives data concerning N supplied from the up/down counter unit 37. The unit 37 integrates the number of error pulses applied with its first input (up count input U) and produces the integrated number defined by the above value N. If the comparison unit 38 determines that the number N from the unit 37 is larger than the number n from the unit 39, it decides that the related transmission line quality may have an error rate value of over $10^{-3}$, and accordingly, produces, at the decision terminal 21, the line switching command.

The counter unit 36 counts the number of overflow detection signals sent from the unit 34 and resets the time comparison unit 35 every time the count number reaches, for example 2. This number "2" is used for assuring or causing a trend to occur which indicates that the error rate is gradually decreasing, which is schematically shown by 90→80→70→50→ and so on (skipping the intermediate numbers 85, 70, 60 therebetween) with reference to row (c) of FIGS. 6B and 6C. Alternatively, if an overflow detection signal is not supplied to the counter unit 36, the time comparison unit 35 is not reset, but the memory unit 39 is updateed by the least value n from the time comparison unit 35, and the value n is maintained in the unit 39.

The up/down counter unit 37 works as a down counter and the integrated number N is decreased if the overflow detection signal is supplied from the unit 34 to the second input (down count input D) of the up/down counter unit 37, since no error pulse is supplied from the OR circuit 31 to the time interval counter unit 33 at least within the predetermined constant term or period. In this case, the down count operation is stopped when the decreased number N reaches zero.

Thus, the system of FIG. 3 performs the supervising operation for the digital radio transmission line in terms of both the number N of the error pulses and the time interval $\Delta t$ thereof in relation to the predetermined value n corresponding to each time interval $\Delta t$. This enables a rapid issuance of the line switching command, particularly when rapid change occurs because of fading, and accordingly, the digital radio communication system can still be maintained at normal operation through line switching even when rapid changes occur in the fading.

Figure 4:
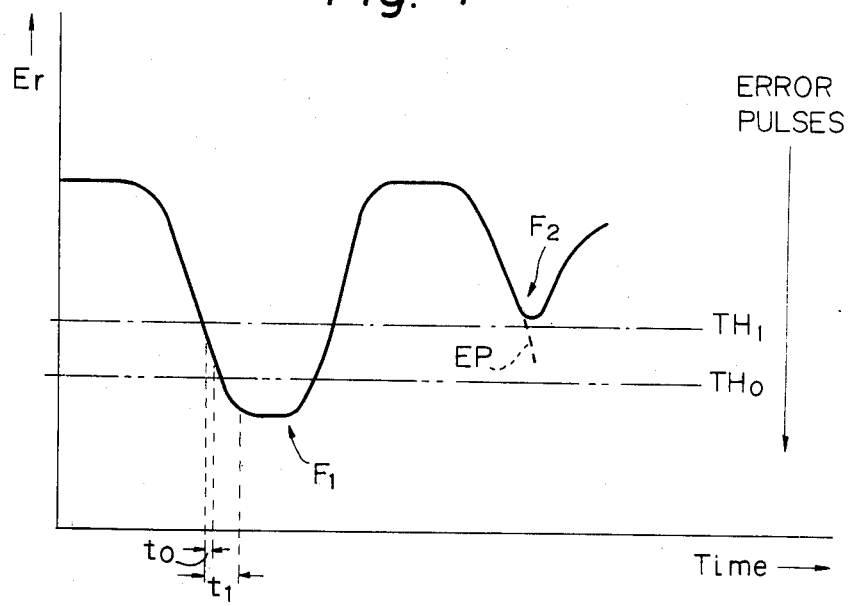
FIG. 4 is a level diagram for explaining the present invention.

FIG. 4 is a level diagram explaining the present invention. In the level diagram, the ordinate indicates a level having an electric field strength Er at the receiver part and the abscissa indicates an elapsed time. The level change of Er is induced by the fading. If serious fading occurs, the level of Er is greatly reduced. When the level of Er is reduced, due to fading, below a critical level $TH_0$, the line switching command is actually issued. In the present invention, the time taken to issue the line switching command is shorter, as denoted by t0 in FIG. 4, even though the rapid change of the fading generally indicated by $F_1$ takes place. This is because the supervisory system of FIG. 3 has the inherent capability of forecasting an occurrence of the passing of the threshold $TH_0$ shortly before the level of Er reaches the threshold level $TH_0$. This forecasting function is derived from a characteristic wherein the line switching command is issued in accordance with the changing ratio of the error pulses. Conversely, the emergency line is also quickly changed over back to the normal line once the transmission line quality of the normal line is restored to an available error rate value of below $10^{-3}$.

As can be understood from the above description, a disadvantage exists in that an erroneous line switching command may be issued if fading such as that shown by $F_2$ takes place; since the supervisory system of the present invention has the forecasting function, the system will forecast that the digital radio communication system can no longer be maintained, if the related lower ratio of the transmission line, deteriorated by the fading, is used, since a large number of error pulses have been generated at this point. Another threshold level $TH_1$ is defined above the level $TH_0$, and the line switching operation must be started at this level $TH_1$. In the prior art, as previously mentioned, it takes a long time to issue the line switching command, as denoted by t1 in FIG. 4. Therefore, the digital radio communication system can not be operated normally at the time when the error pulses increase along a broken line EP and after a delay will produce the line switching command. However, in actuality, the level of Er does not reach the threshold level $TH_1$ but increases, as shown by $F_2$ in FIG. 4, and therefore line switching would not be needed. However, this disadvantage wherein an erroneous line switching command is produced in the present invention is not considered a serious problem for digital radio communication systems, since line switching per se always has a good effect on the radio communication system. In addition, such a disadvantage can be completely offset by the advantage of the present invention, i.e., a rapid response to the fading.

Figure 5:
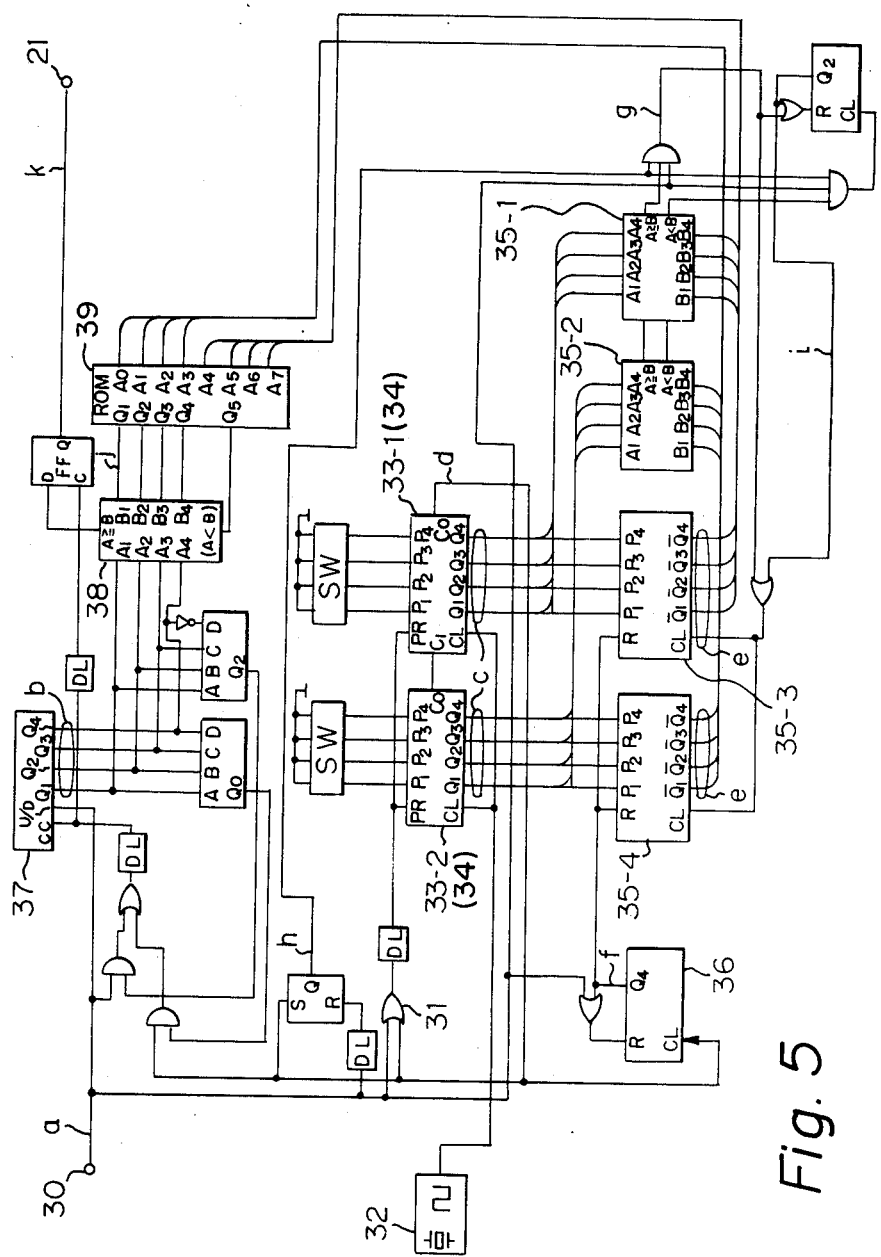
FIG. 5 is a circuit diagram of a detailed example of the supervisory system shown in FIG. 3.

FIG. 5 is a circuit diagram of a detailed example of the supervisory system shown in FIG. 3. In FIG. 5, the members identical to those of FIG. 3 are represented by the same reference numerals. In the present invention, the up/down counter 37, the time interval counter units 33-1, 33-2, and the counter unit 36 can be known products such as the "4029" series; the comparison unit 38, and a part of the time comparison unit 35, i.e., 35-1, 35-2, can be known products such as the "4585" series; and the other part of the time comparison unit 35, i.e., 35-3, 35-4, can be a known product such as the "4035" series.

Figure 6A:
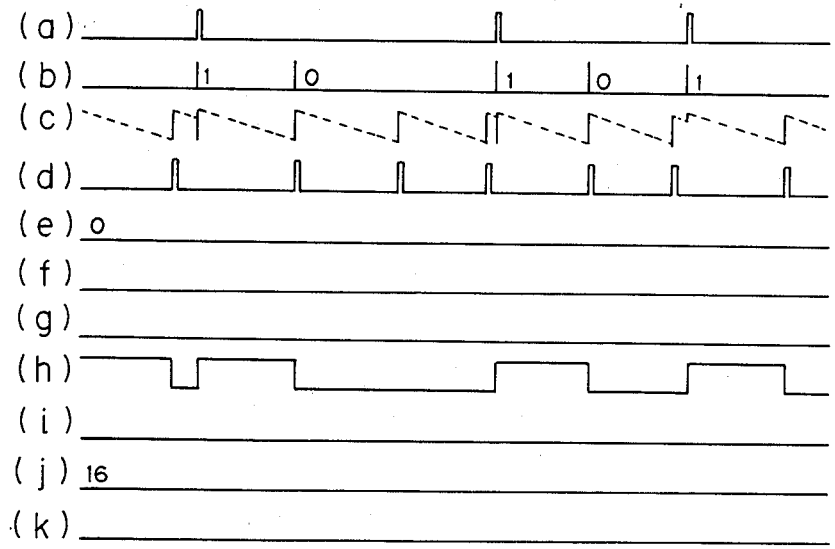
Figure 6B:
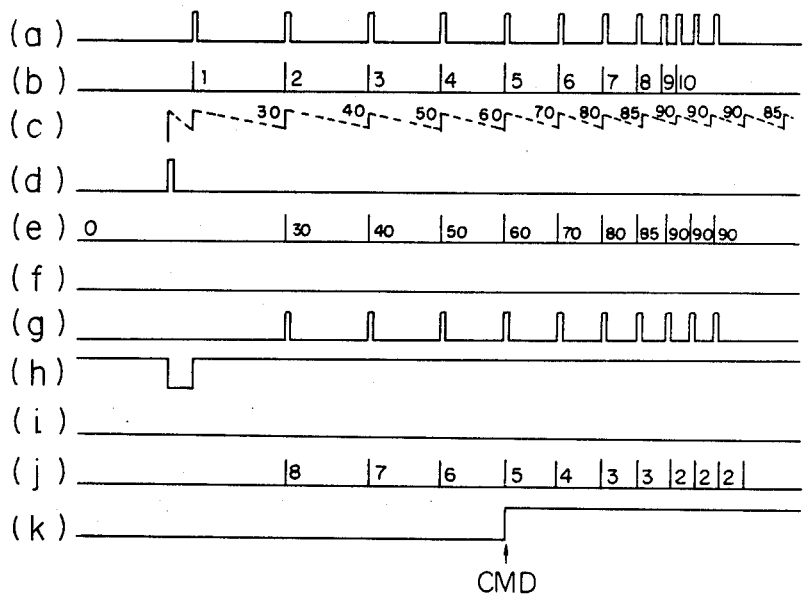

The operation of the circuit shown in FIG. 5 will be explained with reference to the timing charts of signals shown in FIGS. 6A, 6B, and 6C which depict timing charts of signals appearing at main portions in the circuit of FIG. 5. The time chart of FIG. 6A represents a case where the radio transmission line is in good condition, and therefore the error pulses are not frequently generated. The time chart of FIG. 6B represents a case where the condition of the radio transmission line is deteriorated by the fading, and therefore, the error pulses are generated very frequently, thereby causing the line switching command to be issued. The time chart of FIG. 6C represents a case where the fading disappears and the line switching command is released. In each of the FIGS. 6A, 6B and 6C, rows (a), (b), (c), - - - , (k) show pulses appearing at portions a, b, c, - - - , k in FIG. 5, respectively.

With reference to FIGS. 5 and 6A, the error pulses appear at the portion a with the pulse pattern of row (a). The error pulses at a are sequentially applied to the up/down counter unit 37, and therefore, the count number thereof at the portion b changes with 1 or 0, as shown in row (b). The preset value at the portion c is decremented with the timing shown in row (c). The time interval counter unit 33-1 produces, at the portion d, the overflow detection signal as shown in row (d). The overflow detection signal resets the count number of the counter unit 37 to 0, while the count number is incremented by one row (b) every time the error pulse row (a) is generated. A signal at the portion h rises to "H" (high) level every time the error pulse is generated, and then falls to "L" (low) level. The "H" level signal of the portion h gives an instruction to hold the count number at the portion c, but in FIG. 6A, the held number is zero, since the error pulses are not frequently generated. Thus, no line switching command is issued at the portion k as shown in row (k).

With reference to FIGS. 5 and 6B, the line switching command is raised or output as shown by CMD in row (k), since the error pulses are generated very frequently due to fading. The count number of the unit 37 at the portion b is incremented one by one, e.g., 1, 2, 3, and so on, in response to the error pulses at the portion a. Each error pulse of row (a) induces the signal of row (g). This signal (g) gives an instruction to hold the count number of the unit 33-1, 33-2 appearing at the portion c, since the signal of row (h) is now changed to "H" level by the first error pulse of row (a). According to each signal of row (g), the count numbers, such as 30, 40, 50, and so on, are held at the portion e, as shown in row (e). In this case, a preset value "100" is applied from the switches SW to the unit 33-1, 33-2, every time the error pulse of row (a) is generated. If the count number at the portion c is 30, the ROM 39 of the produces the number 8 at the portion j as shown in row (j). Similarly, the ROM produces 7, 6, 5, and so on as shown in row (j) in response to the count number 40, 50, 60, and so on as shown in row (e). In this case the ROM 39 has the information stored therein as shown by Table II.

TABLE II

| Row (c) | Row (j) |
|---------|---------|
| 90 | 2 |
| 80 | 3 |
| 70 | 4 |
| 60 | 5 |
| 50 | 6 |
| 40 | 7 |
| 30 | 8 |
| 20 | 9 |
| 10 | 10 |

When the unit 38 detects that the count number of row (b) coincides with the number of row (j), it produces the line switching command CMD as shown in row (k), where the number is "5".

With reference to FIGS. 5 and 6C, the error pulses are not frequently generated, as in FIG. 6A. Therefore, the hold number of row (e) is decremented by e.g., 80, 70, 50, and 40. These numbers 80, 70, 50 and 40 are read in accordance with signals of row (i). At this time, the ROM 39 produces a fixed number 6 as shown in row (j), and the count number of row (b) is decremented by e.g., 9, 10, 9, 10, 9, 8, 7, 6, 7, 6, 5, and so on. If the count number of row (b) becomes smaller than the number "6" produced from the ROM 39, the line switch command is released, as shown by $\overline{\text{CMD}}$ in row (k).

As explained above in detail, the present invention can provide quick response to the fading due to its forecasting function. Accordingly, the line switching can be achieved without error even though a quick change of the fading takes place.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

I claim:

1. An apparatus for supervising a digital radio transmission path between a transmitter and a receiver, in which the transmitter transmits a message including a data signal and a predetermined bit pattern portion, the portion being used for error rate detection, the receiver receives the portion, produces error pulses from the portion by comparing the portion to a reference and supervises the transmission path quality based on the produced error pulses to issue a path switching command when the detected error rate exceeds a predetermined threshold value, said apparatus comprising;

- means for producing a first number equal to the number of received error pulses by counting the received errors in the portion and for producing a second number proportional to a time interval between two successive error pulses; and
- a comparison unit which receives the first number obtained by counting the received error pulses and the second number produced in accordance with the time interval between two successive error pulses, and produces the line switching command when the first number is greater than or equal to the second number.

2. An apparatus as set forth in claim 1, wherein said means comprises:

- an up/down counter unit, having an up count input, for achieving an up count every time the error pulse is applied to the up count input;
- a time comparison unit, operatively connected to said up/down counter unit, which computes the time interval, and produces a new second number and outputs the new second number if the new second number is less than a previously produced second number; and
- a memory unit, operatively connected to said time comparison unit, for storing the second number updated as the least value produced by said time comparison unit, said time comparison unit including a ROM which stores information defining a relationship between each time interval of the error pulses and the corresponding second number.

3. An apparatus as set forth in claim 2, further comprising a clock generator connected to said time interval counter unit and producing clock pulses and wherein the second number is produced by the ROM in response to data concerning the time interval produced by said time interval counter unit which is driven by the clock pulses supplied from the clock generator.

4. An apparatus as set forth in claim 3, further comprising an overflow detection unit connected to said time interval counter unit and said up/down counter, and which detects an overflow of the count by said time interval counter unit and produces an overflow detection signal which is supplied to reset the count number of said time interval counter unit and supplied to the down count input of the up/down counter unit.

5. An apparatus as set forth in claim 4, further comprising an OR circuit connected to the overflow detection unit and to receive the error pulses and wherein the overflow detection signal is supplied, via said OR circuit, to said time interval counter unit, when said OR circuit receives the error pulses said time interval counter unit is reset every time one of the error pulses is received or when the overflow detection signal is generated.

6. An apparatus as set forth in claim 5, further comprising a counter unit connected to said overflow detection unit, and said time interval comparison unit, for counting the number of the overflow detection signals produced from the overflow detection unit and resetting said time interval comparison unit each time the count number of the overflow detection signals reaches a predetermined number suitable for assuring a trend indicating that the error rate is gradually decreasing, and when the overflow detection signal is not supplied to the counter unit, said time interval counter unit is not reset and said memory unit is updated by the least value from the time comparison unit the counter further operates to transfer a discrimination signal, via a line, to the time comparison unit, which discrimination signal indicates whether the reset operation for the time interval counter unit is caused by the error pulse provided to a first input of the OR circuit or the overflow detection signal given to a second input thereof, wherein, in the former, case, the time comparison unit produces the number corresponding to the time interval from the time interval counter unit in accordance with the information stored in the ROM and, in the latter case, the time comparison unit produces the largest second number stored in the ROM.

7. An apparatus for producing a transmission line switching command, said apparatus comprising:

- error detection means for detecting error in a received digital radio signal; and
- change detecting means for detecting changes in a number of the errors detected by said error detection means and producing the switching command when the number is increasing, said change detecting means comprising:
- projection means for producing an estimated count number in dependence upon the time between successive errors or a minimum count number when the time between the successive errors exceeds a predetermined value as a projected number;
- count means for counting an actual number of errors; and
- comparison means for comparing the actual number with the projected number and producing the switching command when the actual number is greater than or equal to the projected number.

* * * * *

UNITED STATES PATENT AND TRADEMARK OFFICE
CERTIFICATE OF CORRECTION

PATENT NO. : 4,677,619

DATED : June 30, 1987

INVENTOR(S) : Masahisa Kawai

It is certified that error appears in the above-identified patent and that said Letters Patent is hereby corrected as shown below:

Col. 1, line 20, "subjectd" s/b --subjected--;
      line 39, "descussed" s/b --discussed--;
      line 52,
           after "measuring" insert --a--.

Col. 10, line 27, "former," s/b --former--.

Signed and Sealed this

Twelfth Day of January, 1988

Attest:

DONALD J. QUIGG

*Attesting Officer*     *Commissioner of Patents and Trademarks*